United States Patent
Abuellil et al.

(10) Patent No.: US 11,569,823 B2
(45) Date of Patent: Jan. 31, 2023

(54) DLL HAVING EDGE COMBINER WITH MATCHED LOADS

(71) Applicant: SHENZHEN GOODIX TECHNOLOGY CO., LTD., Shenzhen (CN)

(72) Inventors: Amr Abuellil, San Diego, CA (US); Ahmed Emira, San Diego, CA (US); Janakan Sivasubramaniam, San Diego, CA (US)

(73) Assignee: SHENZHEN GOODIX TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 17/176,163

(22) Filed: Feb. 15, 2021

(65) Prior Publication Data

US 2021/0250030 A1 Aug. 12, 2021

Related U.S. Application Data

(63) Continuation-in-part of application No. 16/788,284, filed on Feb. 11, 2020, now Pat. No. 10,924,121.

(51) Int. Cl.
*H03L 7/081* (2006.01)
*H03K 19/20* (2006.01)

(52) U.S. Cl.
CPC .......... *H03L 7/0812* (2013.01); *H03K 19/20* (2013.01)

(58) Field of Classification Search
CPC ..... H03L 7/099; H03L 2207/50; H03L 7/085; H03L 7/0995; H03L 7/0992; H03L 7/08; H03L 7/089; H03L 7/18; H03L 7/0812; H03L 7/23; H03L 7/00; H03L 7/06; H03L 7/185; H03L 7/22; H03L 7/097; H03L 7/10; H03K 2005/00156; H03K 5/086; H03C 3/0908
USPC ....... 327/144, 146, 147, 149, 152, 153, 156, 327/158, 161, 162, 163
See application file for complete search history.

(56) References Cited

U.S. PATENT DOCUMENTS

| | | |
|---|---|---|
| 6,182,236 B1 | 1/2001 | Culley et al. |
| 7,733,138 B2 * | 6/2010 | Uehara ................. H03L 7/0891 327/158 |
| 10,924,121 B1 * | 2/2021 | Abuellil ................ H03L 7/0814 |

* cited by examiner

*Primary Examiner* — Hai L Nguyen
(74) *Attorney, Agent, or Firm* — Kilpatrick Townsend & Stockton LLP

(57) ABSTRACT

A DLL circuit that has a programmable output frequency is provided. The DLL circuit uses a single delay line to produce the multiple frequencies. In various embodiments, the delay line is configured to receive an input clock defining an input clock period. The delay line comprises delay stages, each configured to generate a corresponding output clock having a phase relative to the input clock based on a delay of the delay line. In those embodiments, a control circuit is configured to change the delay of the delay line so as to cause a phase difference between the input clock and a sensed output clock to be substantially equal to the input clock period. An edge combiner is configured to generate a DLL output clock based on the output clocks of the delay stages and presents an equal schematic load for each of the output clocks of the delay stages.

20 Claims, 5 Drawing Sheets

DLL HAVING EDGE COMBINER WITH MATCHED LOADS

CROSS-REFERENCE TO RELATED APPLICATIONS

This application is a continuation in part of U.S. patent application Ser. No. 16/788,284, for "NO FALSE LOCK DLL" filed on Feb. 11, 2020, U.S. Pat. No. 10,924,121, issued on Feb. 16, 2021, which is hereby incorporated by reference in its entirety.

FIELD OF THE INVENTION

The present application generally pertains to Digital Locked Loops (DLLs), and more particularly to DLLs having improved mechanisms for locking.

BACKGROUND OF THE INVENTION

DLLs produce an output frequency based on an input clock, for example, generated based on a crystal oscillator. A delay line generates multiple clocks based on the input clock, and an edge combiners generate an output clock based on the multiple outputs from the delay line. Because the edge combiner presents different loads for different delay line outputs, the output clock is imprecise. Improvements in DLL architecture are needed in the art.

BRIEF SUMMARY OF THE INVENTION

A system of one or more computers can be configured to perform particular operations or actions by virtue of having software, firmware, hardware, or a combination of them installed on the system that in operation causes or cause the system to perform the actions. One or more computer programs can be configured to perform particular operations or actions by virtue of including instructions that, when executed by data processing apparatus, cause the apparatus to perform the actions. One general aspect includes a DLL circuit. The DLL circuit also includes a delay line configured to receive an input clock defining an input clock period, and where the delay line includes a plurality of delay stages, each configured to generate a corresponding output clock having a phase relative to the input clock based on a delay of the delay line. The DLL circuit also includes a control circuit configured to change the delay of the delay line so as to cause a phase difference between the input clock and a sensed output clock to be substantially equal to the input clock period. The DLL circuit also includes an edge combiner, configured to generate a DLL output clock based on the output clocks of the delay stages, where the edge combiner presents an equal schematic load for each of the output clocks of the delay stages. Other embodiments of this aspect include corresponding computer systems, apparatus, and computer programs recorded on one or more computer storage devices, each configured to perform the actions of the methods.

Implementations may include one or more of the following features. The DLL circuit where the edge combiner includes a plurality of first sets of logic gates and a plurality of second sets of logic gates, where each logic gate of each set of the first sets of logic gates is configured to receive an output clock of a different one of the delay stages, where one or more of the logic gates of each set of the first sets of logic gates are configured to generate an output for a corresponding set of logic gates of the second sets of logic gates, and where each of the one or more of the logic gates of the first sets of logic gates configured to generate an output for the corresponding set of logic gates of the second sets of logic gates has an equal schematic output load. The edge combiner includes a third set of logic gates, where each logic gate of each set of the second set of logic gates is configured to receive outputs of a different pair of logic gates of the first sets of logic gates, where at least two of the logic gates of each set of the second sets of logic gates are configured to generate an output for a corresponding logic gate of the third set of logic gates, and where each of the at least two logic gates of the second sets of logic gates configured to generate the output for the corresponding logic gate of the third set of logic gates has an equal schematic output load. Each logic gate of the third set of logic gates is configured to receive outputs of a different set of the second sets of logic gates. The logic gates of the third set of logic gates are each configured to generate a clock having a frequency different from a frequency of the clocks generated by one or more other logic gates of the third set of logic gates. The delay stages each include an output driver configured to generate an output clock for one of the logic gates of each of the first sets of logic gates, and where the output driver is oversized. The delay stages each include an output driver configured to generate an output clock for one of the logic gates of each of the first sets of logic gates, and where the output clock of one or more of the delay stages is received by one or more logic gates of the first sets of logic gates, and where the one or more logic gates of the first sets of logic gates are never used to generate the DLL output clock. The logic gates of the first sets of logic gates are oversized. The outputs of at least two of the logic gates of the first sets of logic gates is received by each logic gate of the second sets of logic gates, and where one or more logic gates of the second sets of logic gates are never used to generate the DLL output clock. The logic gates of the second sets of logic gates are oversized. Implementations of the described techniques may include hardware, a method or process, or computer software on a computer-accessible medium.

DETAILED DESCRIPTION OF THE INVENTION

Particular embodiments of the invention are illustrated herein in conjunction with the drawings.

Various details are set forth herein as they relate to certain embodiments. However, the invention can also be implemented in ways which are different from those described herein. Modifications can be made to the discussed embodiments by those skilled in the art without departing from the invention. Therefore, the invention is not limited to particular embodiments disclosed herein.

The embodiments discussed herein relate to a DLL circuit that has a programmable output frequency. The DLL circuit uses a single delay line to produce the multiple frequencies.

Figure 1:
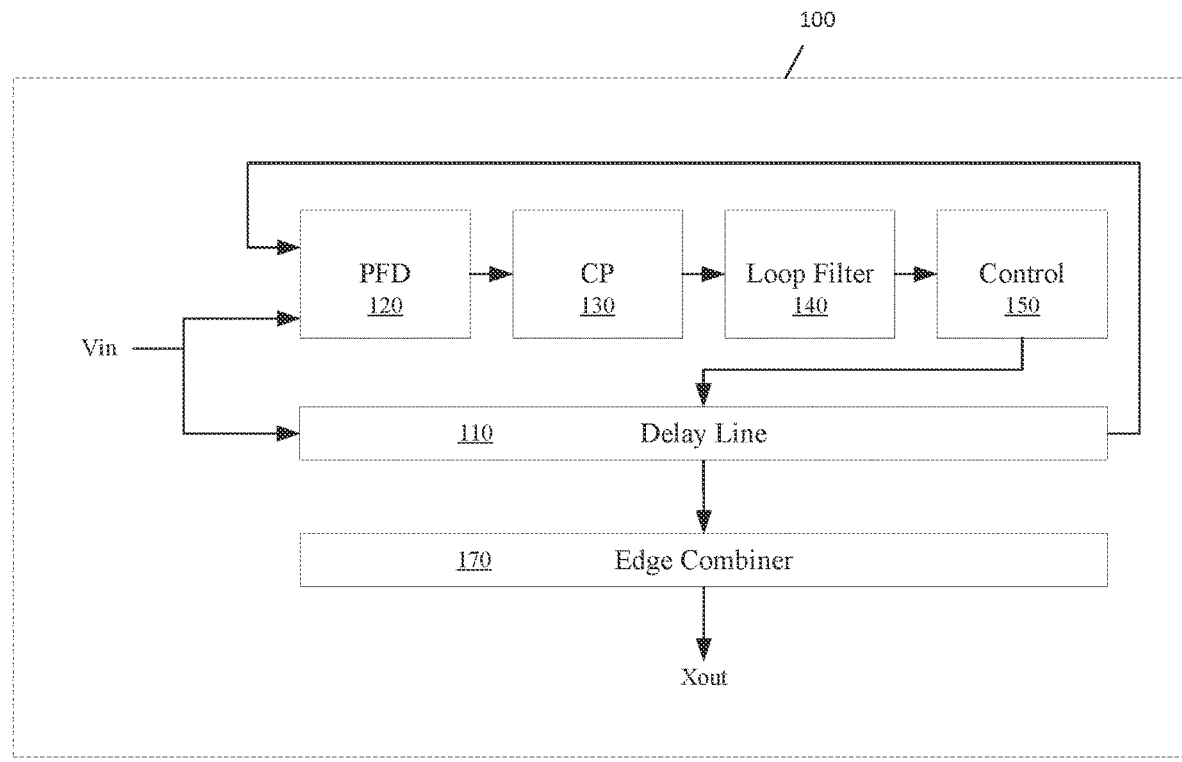
FIG. 1 is a schematic diagram illustrating a conventional DLL circuit.

FIG. 1 is a schematic diagram illustrating a conventional DLL circuit 100. DLL circuit 100 includes delay line 110, phase frequency detector (PFD) 120, charge pump (CP) 130, loop filter 140, control circuit 150, and edge combiner 170.

Delay line 110 is configured to receive an input or reference clock from node Vin. The input clock has a particular input frequency, generated, for example, by a crystal oscillator. Delay line 110 has multiple delay stages which collectively delay the input clock signal by a delay amount equal to the sum of the delays of each of the delay stages.

The delayed input clock signal and the undelayed input clock are provided to PFD 120. PFD 120 generates a series of signals, each indicating a time difference between particular edges of the delayed input clock signal and the undelayed input clock.

The series of signals generated by the PFD 120 are provided to charge pump 130. In response to the series of signals, charge pump 130 generates corresponding pulses for loop filter 140. The pulses generated by charge pump 130 for loop filter 140 cause an analog loop filter voltage to change.

Control circuit 150 influences the delay of each of the delay stages of the delay line 110 based on the analog loop filter voltage of loop filter 140.

As understood by those of skill in the art, delay line 110, PFD 120, charge pump 130, loop filter 140, and control circuit 150 collectively form a feedback loop which functions to align the phase and frequency of the input clock signal and the output signal of the delay line 110.

As understood by those of skill in the art, in some embodiments, a divide block (not shown) is placed between the output of the delay line 110 and the input of PFD 120. In such embodiments, delay line 110, PFD 120, charge pump 130, loop filter 140, and control circuit 150 collectively form a feedback loop which functions to align the phase and frequency of the input clock signal and the divided output signal of the delay line 110. In such embodiments, the output signal of the delay line has a frequency which is substantially equal to the frequency of the input clock signal times the division factor of the divide block.

Edge combiner 170 receives output signals from a number of the delay stages of the delay line 110, each received output signal corresponding with a different phase of the delayed clock. Edge combiner 170 is configured to generate an output clock based on the received phases. Any of a number of conventional edge combiner circuits performing this function may be used.

As understood by those of skill in the art, the architecture of DLL circuit 100 is subject to a false lock condition. As described above, it is desirable for the feedback of DLL circuit 100 to cause alignment of the phase and frequency of the input clock signal and the output signal of the delay line 110. When in a false lock condition, the feedback loop of DLL circuit 100 may cause alignment of the phase and frequency of the input clock signal and the output of the delay line 100 divided by or multiplied by an integer. For example, the feedback of DLL circuit 100 may cause alignment of the phase and frequency of the input clock signal and the output signal of the delay line 110, where the frequency of the output signal of the delay line 110 is two or more times the frequency of the input clock signal. Similarly, the feedback of DLL circuit 100 may cause alignment of the phase and frequency of the input clock signal and the output signal of the delay line 110, where the frequency of the output signal of the delay line 110 is one half or another integer fraction of the frequency of the input clock signal.

Conventional DLL circuits include a false lock detect circuit, which detects false lock conditions, and corrections circuitry which addresses the false lock condition.

Figure 2:
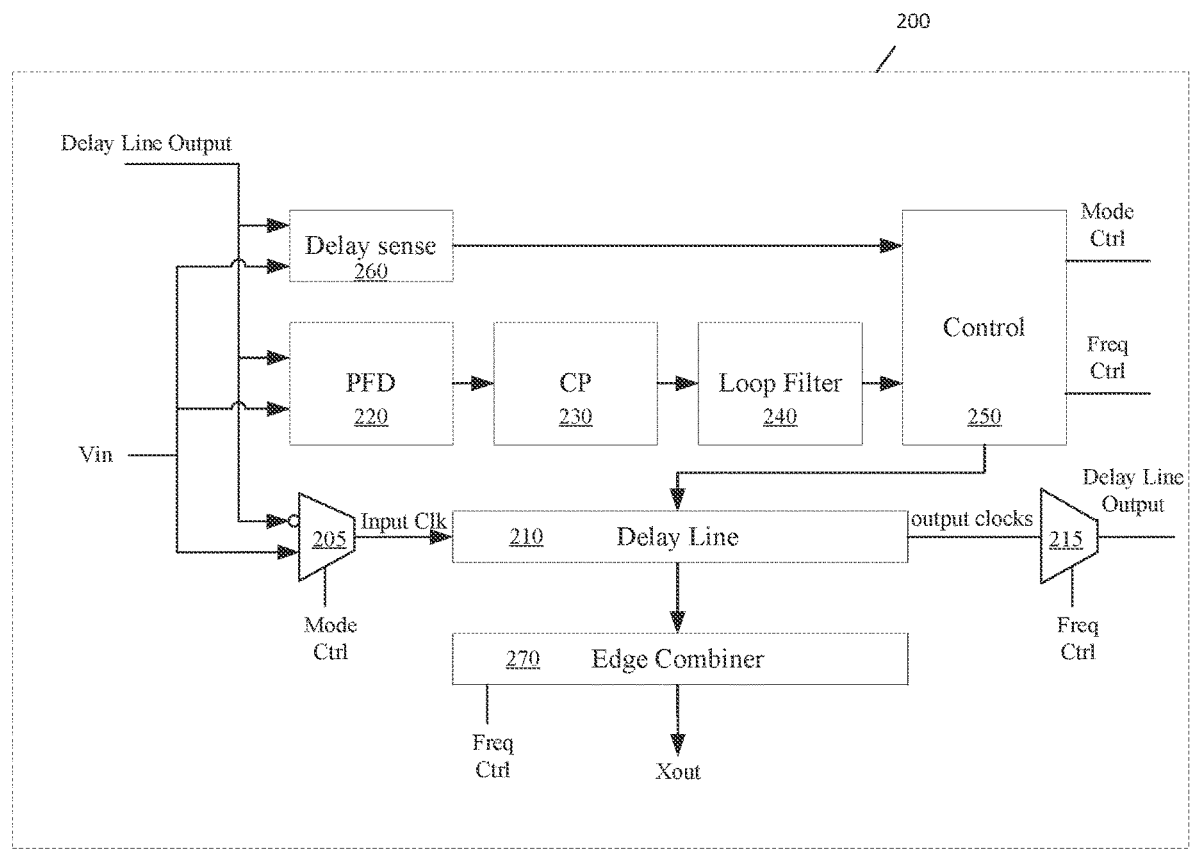
FIG. 2 is a schematic diagram illustrating a non-conventional DLL circuit.

FIG. 2 is a schematic diagram illustrating a non-conventional DLL circuit 200. DLL circuit 200 includes multiplexor 205, delay line 210, multiplexor 215, phase frequency detector (PFD) 220, charge pump (CP) 230, loop filter 240, control circuit 250, delay sense circuit 260, and edge combiner 270.

Delay line 210 is configured to selectively receive an input clock at node Vin. The input clock has a particular input frequency, generated, for example, by a crystal oscillator. Delay line 210 has multiple delay stages which collectively delay the input clock signal by a delay amount equal to the sum of the delays of each of the delay stages.

Multiplexor 215 receives a plurality of output clocks generated by the delay stages. According to a control signal Freq Ctrl provided by controller 250, multiplexor 215 provides a selected one of the received output clocks as the delay line output clock signal.

The delay line output clock signal and the undelayed input clock are provided to PFD 220. PFD 220 generates a series of signals, each indicating a time difference between particular edges of the delay line output clock signal and the undelayed input clock.

The series of signals generated by the PFD 220 are provided to charge pump 230. In response to the series of signals, charge pump 230 generates corresponding pulses for loop filter 240. The pulses generated by charge pump 230 for loop filter 240 cause an analog loop filter voltage to change.

Control circuit 250 influences the delay of each of the delay stages of the delay line 210 based on the analog loop filter voltage of loop filter 240.

As understood by those of skill in the art, delay line 210, PFD 220, charge pump 230, loop filter 240, and control circuit 250 collectively form a feedback loop which functions to align the phase and frequency of the input clock signal and the delay line output signal from multiplexor 215.

As understood by those of skill in the art, in some embodiments, a divide block (not shown) is placed between the output of the multiplexor 215 and the input of PFD 220. In such embodiments, delay line 210, PFD 220, charge pump 230, loop filter 240, and control circuit 250 collectively form a feedback loop which functions to align the phase and frequency of the input clock signal and the divided delay line output signal from multiplexor 215. In such embodiments, the output signal of the delay line has a frequency which is substantially equal to the frequency of the input clock signal times the division factor of the divide block. For purposes of this application, in embodiments using a divide block, the output of the divide block is referenced as the output of the multiplexor 215.

Edge combiner 270 receives input and output signals from a number of the delay stages of the delay line 210, each received output signal corresponding with a different phase of the delayed clock. Edge combiner 270 is configured to generate an output clock at output node Xout based on the received phases. For example, edge combiner 270 may receive input and output signals from each of five delay stages, and generate an output clock at output node Xout based on the input and output signals. For example, edge combiner 270 may be configured to generate a clock having a frequency five times the frequency of the input clock signal based on the input and output signals from each of the five delay stages. Similarly, edge combiner 270 may be configured to generate a clock having a frequency three or seven or another number times the frequency of the input clock signal based on the input and output signals from each of three or seven delay stages. Any of a number of conventional edge combiner circuits performing this function may be used.

The architecture of DLL circuit 200 locks quickly and is not subject to a false lock condition.

In response to the at least one of the phase and frequency of the delay line 210 being different from the input clock by an amount greater than a threshold, control circuit 250 causes the DLL circuit 200 to operate in a lock assist mode. Once the lock assist mode causes the at least one of the phase and frequency of the delay line 210 being different from the input clock by an amount less than the threshold, or less than another threshold (for example for hysteresis), the control circuit 250 causes the DLL circuit 200 to operate in a normal operating mode.

During the lock assist mode, the DLL circuit 200 is configured to program the delay line with a delay value approximately equal to the delay value for locked normal operation. Once the delay value of the delay line 210 is approximately equal to the delay value for normal operation, the DLL circuit 200 exits lock assist mode, and enters the normal operating mode, where the DLL feedback loop is used to modify the delay line output signal such that its phase and frequency are approximately equal to that of the input clock signal.

During the lock assist mode, instead of receiving its input from the input clock at node Vin, the delay line 210 receives its input from the output of the multiplexor 215, as controlled by multiplexor 205 based on the Mode Ctrl signal from controller 250. Therefore, during the lock assist mode, the delay line 210 does not receive input from and does not respond to the input clock at node Vin. Instead, because the inverted output of the multiplexor 215 is connected to the input of the delay line 210, the delay line 210 acts as a ring oscillator while in the lock assist mode.

In some embodiments, the desired condition for completion of the lock assist mode is that the delay of delay line 210 causes the ring oscillator to oscillate at a frequency approximately half the frequency of the input clock signal. As understood by those of skill in the art, this corresponds with the condition that the delay of delay line 210 is approximately equal to the period of the input clock signal.

During the lock assist mode, instead of control circuit 250 modifying the delay of the delay line 210 based on the analog loop filter voltage, control circuit 250 modifies the delay of delay line 210 based on a signal from delay sense circuit 260 where the signal from delay sense circuit 260 indicates whether the delay of delay line 210 is less than or is greater than a threshold value.

In some embodiments, during the lock assist mode, control circuit 250 modifies the delay of delay line 210 by changing the analog loop filter voltage based on whether the signal from delay sense circuit 260 indicates that the delay of delay line 210 is less than or is greater than the threshold value.

In alternative embodiments, the delay line 210 is programmable, and the control circuit 250 programs the delay line 210. For example, each of the outputs of the delay stages of the delay line 210 may be connected to a programmable capacitive load, and, during the lock assist mode, control circuit 250 modifies the value of the programmable capacitive loads based on whether the signal from delay sense circuit 260 indicates that the delay of delay line 210 should be increased or decreased according to whether the delay of the delay line is less than or is greater than a threshold value.

In alternative embodiments, alternative delay programming methods may be used. In embodiments using a programmable delay line 200, during the lock assist mode, while the delay line 210 is being programmed, control circuit 250 may cause the analog loop filter voltage of loop filter 240 to be equal to a voltage substantially in the middle of a functional range of the analog loop filter voltage use during normal operation, such as within about 10% of the middle of the functional range.

As discussed above, delay sense circuit 260 provides a signal indicating whether the delay of delay line 210 should be increased or decreased. In some embodiments, delay sense circuit 260 also provides a signal indicating whether the delay of delay line 210 is acceptable and should not be increased or decreased.

In some embodiments, delay sense circuit 260 comprises a resettable counter. For example, delay sense circuit 260 may comprise a counter which increments in response to receiving rising clock edges from the input clock in which is reset in response to receiving a rising edge from the output of delay line 210.

As understood by those of skill in the art, the desired condition that the delay of delay line 210 is approximately equal to the period of the input clock signal corresponds with the condition that two rising edges of the input clock occur for every one rising edge of the output of the delay line 210. Accordingly, in response to the counter having counted less than two rising edges of the input clock when being reset, the counter generates a signal for control circuit 250 indicating that the delay of delay line 210 should be increased. Additionally, in response to the counter having counted two or more rising edges of the input clock when being reset, the counter generates a signal for control circuit 250 indicating that the delay of delay line 210 should be decreased.

In some embodiments, control circuit 250 is configured to use the signals from delay sense circuit 260 with a linear search algorithm to determine that the delay of the delay line is approximately equal to the period of the input clock signal. In some embodiments, control circuit 250 is configured to use the signals from delay sense circuit 260 with a binary search algorithm to determine that the delay of the delay line is approximately equal to the period of the input clock signal.

Once the delay value of the delay line 210 is determined to be approximately equal to the period of the input clock signal, the DLL circuit 200 exits lock assist mode, and enters the normal operating mode, where the DLL feedback loop using the analog loop filter voltage is used to modify the output signal of the delay line 210 such that its phase and frequency are approximately equal to that of the input clock signal.

For example, the delay line stages may each include a current starved inverter, and the analog loop filter voltage may be used to control the current of the current starved inverters.

Because the DLL circuit 200 and enters normal operating mode after the delay value of the delay line 210 is approximately equal to the period of the input clock signal, the normal operating mode causes the DLL circuit 200 to properly lock, and therefore the DLL circuit 200 locks quickly, and is not subject to false locking.

Figure 3:
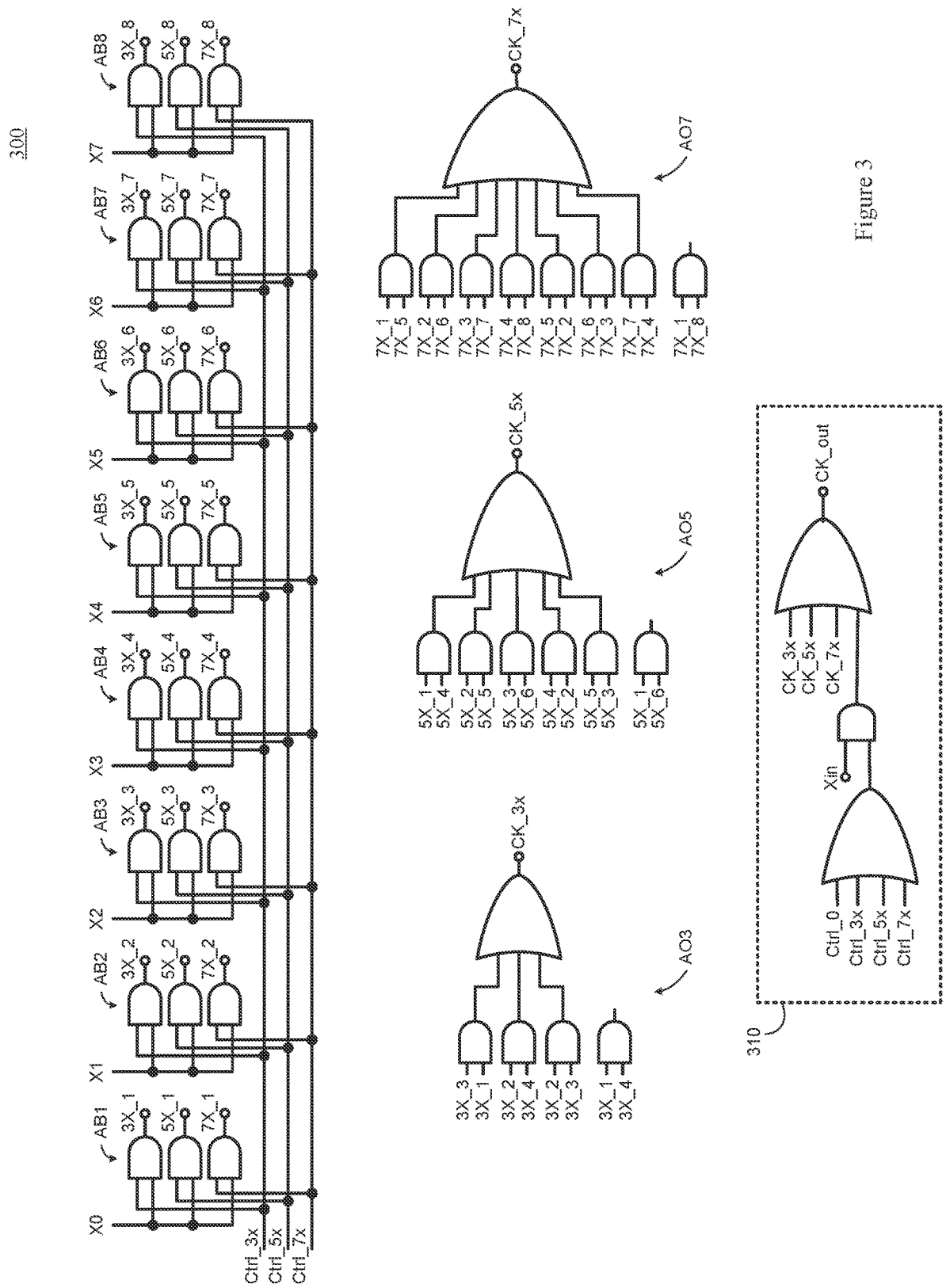
FIG. 3 is a schematic illustration of an embodiment of an edge combiner circuit.

FIG. 3 is a schematic illustration of an embodiment of an edge combiner circuit 300. Edge combiner circuit 300 may be used, for example, as the edge combiner circuit 270 of DLL circuit 200 of FIG. 2, where delay line 400 of FIG. 4, discussed below, is used as delay line 210 of DLL circuit 200. Other edge combiner circuits having features similar or identical to edge combiner circuit 300, as understood by those of skill in the art, may be used in DLL circuit 200.

Edge combiner circuit 300 receives delay line clock signals X0-X7 from delay line 400, and generates an output signal at output node CK_Out based on the received delay line clock signals. Edge combiner circuit 300 also receives frequency control signals Ctrl_0, Ctrl_3x, Ctrl_5x, and Ctrl_7x from control circuit 250, and generates the appropriate output signal based on the received frequency control signals.

As shown, each of delay line clock signals X0-X7 is received by a corresponding one AND gate bank of AND gate banks AB1-AB8, where each of AND gate banks AB1-AB8 includes three AND gates. As shown, each of the three AND gates of each AND gate bank AB[1-8] receives a corresponding clock signal X[0-7]. In addition, each of the three AND gates of each AND gate bank AB[1-8] receives one of the frequency control signals Ctrl_3x, Ctrl_5x, and Ctrl_7x.

In this embodiment, at most one of the frequency control signals Ctrl_3x, Ctrl_5x, and Ctrl_7x is high, and at least two of the frequency control signals Ctrl_3x, Ctrl_5x, and Ctrl_7x are low. Accordingly, at least two of the outputs of each of the AND gate banks AB1-AB8 are fixed low, and, if one of the frequency control signals Ctrl_3x, Ctrl_5x, and Ctrl_7x is high, the AND gate receiving the high frequency control signal generates an output corresponding with its received clock signal X[0-7].

When all of the frequency control signals Ctrl_3x, Ctrl_5x, and Ctrl_7x are low, all of the outputs of the AND gate banks AB1-AB8 are fixed low.

As illustrated in FIG. 7, AND OR circuit AO7 receives the 7× outputs of AND gate banks AB1-AB8, AND OR circuit AO5 receives the 5× outputs of AND gate banks AB1-AB8, AND OR circuit AO3 receives the 3× outputs of AND gate banks AB1-AB8.

The control circuit 250 causes frequency control signal Ctrl_7x to be high, for example, when output frequency of the output clock of DLL circuit 200 is to be seven times the frequency of the input clock.

In response to the control circuit 250 causing frequency control signal Ctrl_7x to be high, the 7× outputs of AND gate banks AB1-AB8 respectively correspond with delay line clock signals X0-X7. AND OR circuit AO7 receives the 7× outputs of AND gate banks AB1-AB8, and generates a clock signal at node CK_7x according to the logic illustrated in the schematic.

In response to frequency control signals Ctrl_3x and Ctrl_5x being low while frequency control signal Ctrl_7x is high, the 3× and 5× outputs of AND gate banks AB1-AB8 are low. Accordingly, AND OR circuits AO3 and AO5 received only low signal inputs, and therefore respectively generate fixed low clock signals at nodes CK_3x and CK_5x.

The control circuit 250 causes frequency control signal Ctrl_5x to be high, for example, when output frequency of the output clock of DLL circuit 200 is to be five times the frequency of the input clock.

In response to the control circuit 250 causing frequency control signal Ctrl_5x to be high, the 5× outputs of AND gate banks AB1-AB6 respectively correspond with delay line clock signals X0-X5. AND OR circuit AO5 receives the 5× outputs of AND gate banks AB1-AB6, and generates a clock signal at node CK_5x according to the logic illustrated in the schematic.

In this embodiment, the control circuit 250 causes delay line 400 to force delay line clock signals X6 and X7 to be low. Accordingly, the 5× outputs of AND gate banks AB7 and AB8 are low.

In response to frequency control signals Ctrl_3x and Ctrl_7x being low while frequency control signal Ctrl_5x is high, the 3× and 7× outputs of AND gate banks AB1-AB8 are low. Accordingly, AND OR circuits AO3 and AO7 received only low signal inputs, and therefore respectively generate fixed low clock signals at nodes CK_3x and CK_7x.

The control circuit 250 causes frequency control signal Ctrl_3x to be high, for example, when output frequency of the output clock of DLL circuit 200 is to be three times the frequency of the input clock.

In response to the control circuit 250 causing frequency control signal Ctrl_3x to be high, the 3× outputs of AND gate banks AB1-AB6 respectively correspond with delay line clock signals X0-X3. AND OR circuit AO3 receives the 3× outputs of AND gate banks AB1-AB4, and generates a clock signal at node CK_3x according to the logic illustrated in the schematic.

In this embodiment, the control circuit 250 causes delay line 400 to force delay line clock signals X4-X7 to be low. Accordingly, the 3× outputs of AND gate banks AB5-AB8 are low.

In response to frequency control signals Ctrl_5x and Ctrl_7x being low while frequency control signal Ctrl_3x is high, the 5× and 7× outputs of AND gate banks AB1-AB8 are low. Accordingly, AND OR circuits AO5 and AO7 received only low signal inputs, and therefore respectively generate fixed low clock signals at nodes CK_5x and CK_7x.

Output stage 310 receives the clock signals at nodes CK_3x, CK_5x, and CK_7x, frequency control signals Ctrl_0, Ctrl_3x, Ctrl_5x, and Ctrl_7x, and a clock signal at node Xin which is identical or substantially identical to the input clock at input node Vin.

In accordance with the logic of the illustrated schematic, if any of frequency control signals Ctrl_3x, Ctrl_5x, and Ctrl_7x are high, the output stage 310 generates an output signal at output node CK_Out according to the clock signal at the one of nodes CK_3x, CK_5x, and CK_7x corresponding with the high control signal.

In addition, if frequency control signal Ctrl_0 is high, the output stage 310 generates a fixed low as the output signal at output node CK_Out.

Furthermore, if all of frequency control signals Ctrl_0, Ctrl_3x, Ctrl_5x, and Ctrl_7x are low, the output stage 310 generates an output signal at output node CK_Out according to the clock signal at node Xin.

As illustrated, each of clock signals X0-X7 has an identical schematic load.

As understood by those of skill in the art, physical layout variation and manufacturing process variation introduces an amount of difference in the load for clock signals X0-X7 and for the other devices, structures, and signals discussed herein as having or presenting identical schematic loads. Accordingly, in some embodiments, the schematic load (e.g. the load which is represented or understood from a schematic representation of the circuit) for the devices, structures, and signals in manufactured devices may be identical. In some embodiments, the actual difference in the load among the devices, structures, and signals may be dominated by physical layout difference among the wires and devices causing the loads. In some embodiments, the load among the devices, structures, and signals represented in a physical layout plan (e.g. known as the layout) of the circuit are identical. In some embodiments, the actual difference in the load among the devices, structures, and signals may be dominated or caused solely by manufacturing variations among the wires and devices causing the loads.

Each of clock signals X0-X7 drives one input of each of the AND gates of the corresponding AND gate bank. In addition, at most only one of the AND gates of the corresponding AND gate bank has a switching output. Accordingly, at least two of the AND gates of the corresponding AND gate bank have a fixed output. Each of clock signals X0-X7 having an identical schematic load is advantageous at least because propagation delay variation among clock signals X0-X7 is minimized. Because the schematic loads are identical, the cause of propagation delay variation among clock signals X0-X7 is limited to physical layout variations and manufacturing variations. In some embodiments, physical layout variations are eliminated by using identical physical layouts for like circuits and wiring connections, as understood by those of skill in the art.

In order to ensure that the schematic loads of clock signals X0-X7 are identical, certain AND gates of AND banks AB1-AB8 are included but have outputs which are not connected to inputs of any other circuits. For example, AND gates which generate outputs 3X_5, 3X_6, 3X_7, and 3X_8 have outputs which are not connected to any other circuits. Similarly, AND gates which generate outputs 5X_7 and 5X_8 have outputs which are not connected to any other circuits.

As illustrated, each of the AND gate output signals for a particular AND OR circuit has an identical schematic load. Each AND gate of the AND banks AB1-AB8 drives inputs of two AND gates the corresponding AND OR circuit. Each of the AND gate output signals for a particular AND OR circuit having an identical schematic load is advantageous at least because propagation delay variation among the AND gate output signals is minimized. Because the schematic loads are identical, the cause of propagation delay variation among the AND gate output signals is limited to physical layout variations and manufacturing variations. In some embodiments, physical layout variations are eliminated by using identical physical layouts for like circuits and wiring connections, as understood by those of skill in the art.

In order to ensure that the schematic loads of the AND gate output signals for a particular AND OR circuit are identical, certain AND gates of the AND OR circuits AO3, AO5, and AO7 are included but have outputs which are not connected to inputs of any other circuits. For example, the AND gate of AND OR circuit AO3, which receives AND gate output signals 3X_1 and 3X_4 generates an output which is not connected to any other circuits. Similarly, the AND gate of AND OR circuit AO5, which receives AND gate output signals 5X_1 and 5X_6 generates an output which is not connected to any other circuits, and the AND gate of AND OR circuit AO7, which receives AND gate output signals 7X_1 and 7X_6 generates an output which is not connected to any other circuits.

Figure 4:
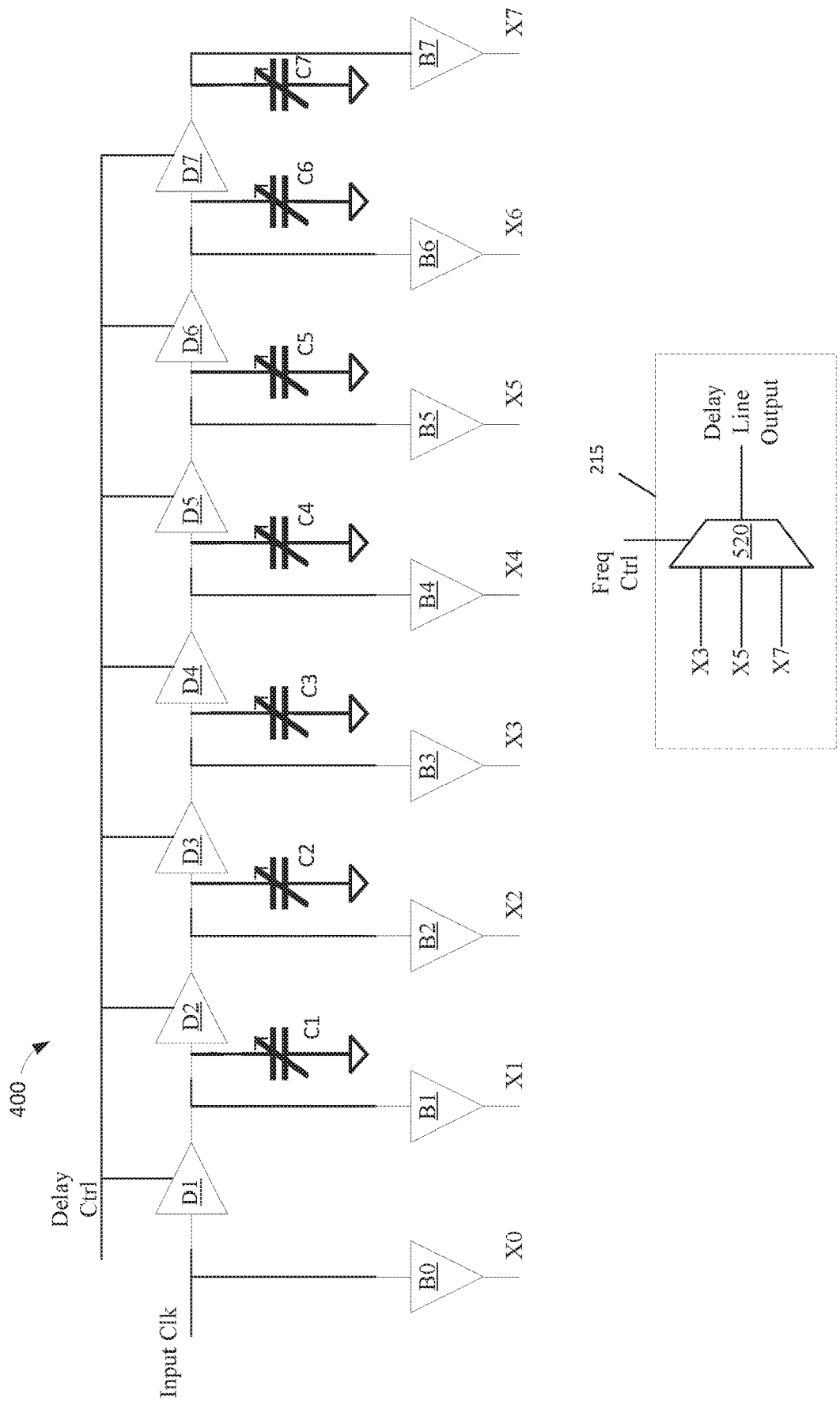
FIG. 4 a schematic illustration of a delay line.

FIG. 4 a schematic illustration of a delay line 400, which may be used as delay line 210 in DLL circuit 200 of FIG. 2 with edge combiner 300, discussed above, as edge combiner 270 of DLL circuit 200. For convenience, multiplexor 215 of DLL circuit 200 is also illustrated. Multiplexor 215 is configured to have a programmable output frequency. Other embodiments of delay lines may be used as delay line 210 in DLL circuit 200 of FIG. 2.

As shown, delay line 400 includes delay stages, D1-D7, programmable capacitors C1-C7, buffers B1-B7, and multiplexer 520.

The multiplexer 205 of FIG. 2 is configured to pass an inverted version of the selected delay line output at node Delay Line Output or to pass oscillator input at input node Vin to the first delay stage D1 according to a signal at mode input at node Mode Ctrl from controller 250. While in lock assist mode, multiplexer 205 is configured to pass the inverted version of the selected delay line output to the first delay stage D1. While in normal operation mode, multiplexer 205 is configured to pass oscillator input at input node Vin to the first delay stage D1.

Delay stages D1-D7 may comprise any controllable delay stage, as known in the art. For example, each of delay stages D1-D7 may include one or more current starved inverters, as known in the art. During normal operation, the control circuit modifies a signal at node Delay Ctrl based on the analog loop filter voltage. In some embodiments, the voltage at node Delay Ctrl is equal to the analog loop filter voltage. In some embodiments, the voltage at node Delay Ctrl is based on the analog loop filter voltage. The propagation delay time of each of the delay stages D1-D7 is modified according to the signal at node Delay Ctrl.

As illustrated, each of delay stages D1-D7 drives a corresponding one of programmable capacitors C1-C7. During lock assist mode, the control circuit uses a search algorithm (e.g. binary or linear) to determine that the delay of the delay line by modifying the capacitance of the programmable capacitors C1-C7, as discussed elsewhere herein.

Buffers B0-B7 generate corresponding clock signals X0-X7, as understood by those of skill in the art.

Multiplexer 215 is configured to pass one of clock signals X3, X5, and X7 as the output of the delay line at output node Delay Line Output. In other embodiments, different clock signals and/or a different number of clock signals may be selected as the output of the delay line at output node Delay Line Output. Which of clock signals X3, X5, and X7 is passed is the output of the delay line is determined according to the signal at node or bus Freq Ctrl. The signal at node or bus Freq Ctrl is determined by the control circuit 250.

In some embodiments, when operated in certain frequency modes, delay stages and/or buffers which are not used may be powered down. For example, if the clock signal X3 is passed as the delay line output, delay stages D4-D7 and/or buffers B4-B7 may be turned off by the control circuit, for example, to save power and/or noise.

If used as delay line 210 in DLL circuit 200 of FIG. 2, when DLL circuit 200 is operated in the lock assist mode, the output of the delay line at output node Delay Line Output is used to generate the delay line input clock at node Input Clk of FIG. 2.

Figure 5:
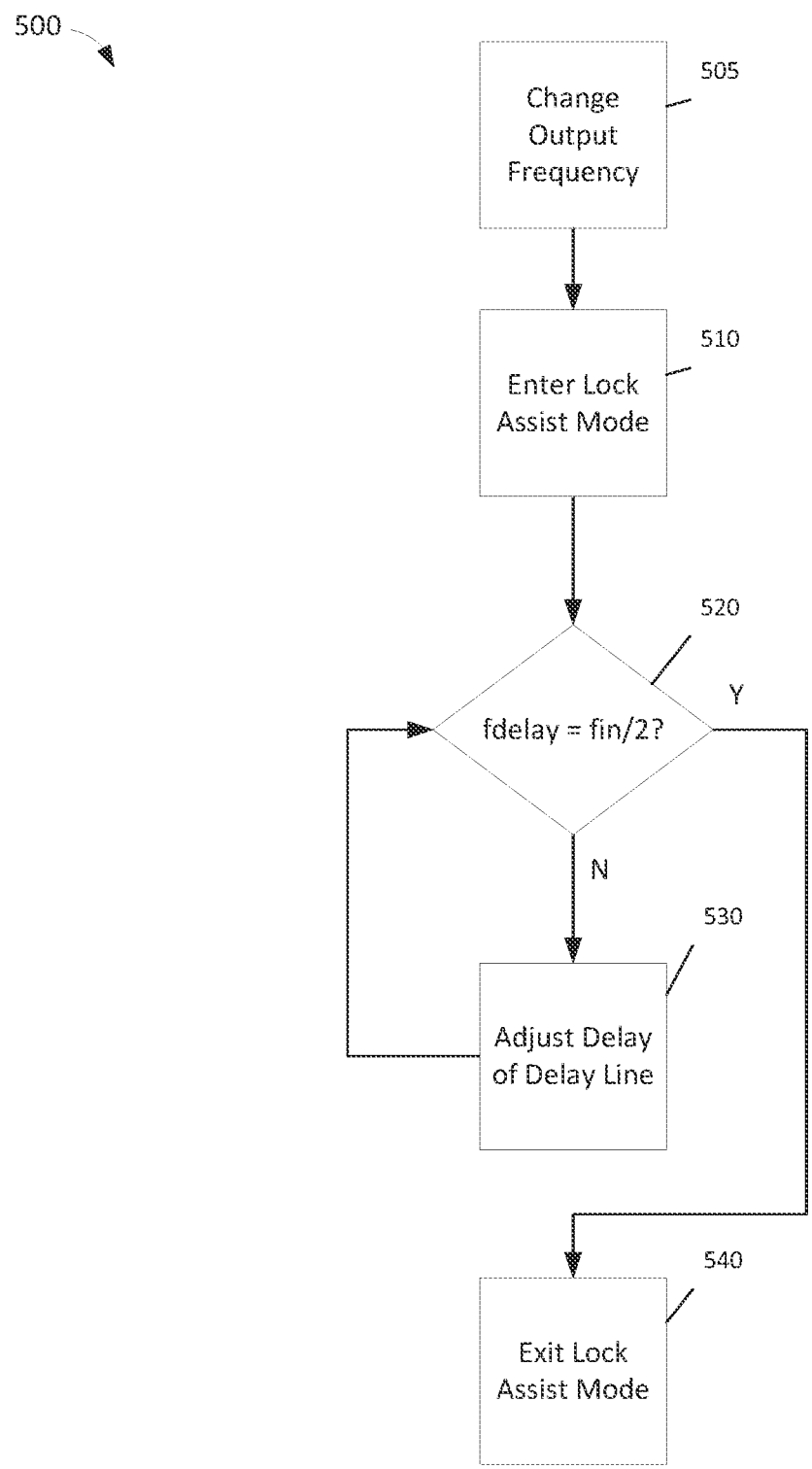
FIG. 5 is a flowchart diagram illustrating an embodiment of a method of operating an embodiment of DLL circuit.

FIG. 5 is a flowchart diagram illustrating an embodiment of a method 500 of operating an embodiment of a DLL circuit. In the described embodiment, DLL circuit 200, which has edge combiner 300 as its edge combiner 270 and has delay line 400 as its delay line 270, performs the method. The method may be performed by other DLL circuits.

At 505, control circuit 250 changes the value of the signal at node or bus Freq Ctrl to cause DLL circuit 200 to change the frequency of the output clock at output node Xout. For example, while generating an output clock having a frequency seven times the frequency of the input clock, the control circuit 250 may change the value of the signal at node or bus Freq Ctrl to cause DLL circuit to change the frequency of the output clock to be five times the frequency of the input clock. Other frequency changes may be made.

At 510, control circuit 250 causes the DLL circuit 200 to operate in a lock assist mode. In some embodiments, the control circuit causes the DLL circuit to operate in lock assist mode as part of a process of changing output frequency of the DLL circuit 200. In some embodiments, the control circuit causes the DLL circuit to operate in lock assist mode in response to the at least one of the phase and frequency of the delay line 400 being different from the input clock by an amount greater than a threshold, which occurs as a result of the change in output frequency of the delay line 400, which occurs as a result of the control circuit 250 changing the value of the signal at node or bus Freq Ctrl.

The control circuit 250 causes the DLL circuit to operate in the lock assist mode at least by changing the state of the mode input signal at node Mode Ctrl so as to cause multiplexer 205 to pass an inverted version of the delay line output to the first delay stage D1. In some embodiments, the control circuit also powers down one or more or all of delay stage D6, delay stage D7, buffer B6, and buffer B7, as these elements are no longer needed. In addition, in some embodiments, the control circuit 250 causes the DLL circuit 200 to operate in the lock assist mode at least by causing the analog loop filter voltage of loop filter 240 to be equal to a voltage substantially in the middle of a functional range of the analog loop filter voltage use during normal operation. In addition, in some embodiments, the control circuit 250 causes the DLL circuit 200 to operate in the lock assist mode at least by performing a method of causing the delay of delay line 400 to become approximately equal to the period of the input clock signal by modifying the capacitance of programmable capacitors C1-C5 according to a linear or binary search algorithm, as described elsewhere herein.

At 520, control circuit 250 determines whether the at least one of the phase and frequency of the delay line output is different from the input clock by an amount less than a threshold. For example, the control circuit 250 may determine whether the at least one of the phase and frequency of the delay line output is different from the input clock by an amount less than a threshold based on signals from delay sense circuit 260, as discussed elsewhere herein.

In response to control circuit 250 determining that the at least one of the phase and frequency of the delay line output is different from the input clock by an amount greater than the threshold, the control circuit 250 determines whether the delay of the delay line should be increased or decreased, and the method proceeds to 530, where control circuit 250 increases or decreases the delay of the delay line.

Control circuit 250 may increase or decrease the delay of the delay line, for example, by changing a programming state of a programmable feature of the delay stages of the delay line. For example, as discussed elsewhere, control circuit 250 may increase or decrease the delay of the delay line by changing the capacitance values of programmable capacitors C1-C5 of delay line 400. As understood by those of skill in the art, increasing the capacitance values of the programmable capacitors C1-C5 increases the delay of the delay line, and decreasing the capacitance values of the programmable capacitors C1-C5 decreases the delay of the delay line.

Once the delay of the delay line is increased or decreased, the method returns to 520.

In response to control circuit 250 determining that the at least one of the phase and frequency of the delay line output is not different from the input clock by an amount greater than the threshold being used, the control circuit 250 causes the DLL circuit 200 to operate in a normal operating mode at 540.

The control circuit 250 causes the DLL circuit to operate in the normal operating mode at least by changing the state of the mode input signal at node Mode Ctrl so as to cause multiplexer 205 to pass the input clock at Vin to the first delay stage D1. In some embodiments, the control circuit 250 causes the DLL circuit 200 to operate in the normal operating mode at least by causing the analog loop filter voltage of loop filter 240 to be modified by charge pump circuit 230.

In addition, in some embodiments, the control circuit 250 causes the DLL circuit 200 to operate in the normal operating mode by modifying delay of the delay stages D1-D5 of the delay line 400 by repeatedly modifying the delay line output such that its phase and frequency become approximately equal to that of the input clock signal at Vin. For example, the delay line stages may each include a current starved inverter, and the analog loop filter voltage may be used to control the current of the current starved inverters.

Though the present invention is disclosed by way of specific embodiments as described above, those embodiments are not intended to limit the present invention. Based on the methods and the technical aspects disclosed herein, variations and changes may be made to the presented embodiments by those of skill in the art without departing from the spirit and the scope of the present invention.

What is claimed is:

1. A DLL circuit, comprising:
    a delay line configured to receive an input clock defining an input clock period, and wherein the delay line comprises a plurality of delay stages, each configured to generate a corresponding output clock having a phase relative to the input clock based on a delay of the delay line, and the delay line generates a delay line output based on the output clocks of the delay stages;
    a feedback control loop circuit to receive a reference clock signal and to receive the delay line output in feedback from the delay line, and configured to:
        determine a phase difference between the delay line output and the reference clock;
        set a mode to a first mode responsive to determining that the phase difference is not greater than a threshold difference, and to a second mode responsive to determining that the phase different is greater than the threshold difference; and
        control the delay of the delay line so as to cause the phase difference between the input clock and the delay line output to be kept substantially equal to the input clock period;
    a multiplexer configured to selectively output the input clock to the delay line by:
        in the first mode, outputting the input clock as the reference clock coupled with a first input of the multiplexer; and
        in the second mode, outputting the input clock as the delay line output coupled in feedback with a second input of the multiplexer, such that the delay line is configured as a ring oscillator in the second mode; and
    an edge combiner, configured to generate a DLL output clock based on the output clocks of the delay stages, wherein the edge combiner presents an equal schematic load for each of the output clocks of the delay stages.

2. The DLL circuit of claim 1, wherein the edge combiner comprises a plurality of first sets of logic gates and a plurality of second sets of logic gates, wherein each logic gate of each set of the first sets of logic gates is configured to receive an output clock of a different one of the delay stages, wherein one or more of the logic gates of each set of the first sets of logic gates are configured to generate an output for a corresponding set of logic gates of the second sets of logic gates, and wherein each of the one or more of the logic gates of the first sets of logic gates configured to generate the output for the corresponding set of logic gates of the second sets of logic gates has an equal schematic output load.

3. The DLL circuit of claim 2, wherein the edge combiner comprises a third set of logic gates, wherein each logic gate of each set of the second set of logic gates is configured to receive outputs of a different pair of logic gates of the first sets of logic gates, wherein at least two of the logic gates of each set of the second sets of logic gates are configured to generate an output for a corresponding logic gate of the third set of logic gates, and wherein each of the at least two logic gates of the second sets of logic gates configured to generate the output for the corresponding logic gate of the third set of logic gates has an equal schematic output load.

4. The DLL circuit of claim 3, wherein each logic gate of the third set of logic gates is configured to receive outputs of a different set of the second sets of logic gates.

5. The DLL circuit of claim 4, wherein the logic gates of the third set of logic gates are each configured to generate a clock having a frequency different from a frequency of the clocks generated by one or more other logic gates of the third set of logic gates.

6. The DLL circuit of claim 2, wherein the delay stages each comprise an output driver configured to generate an output clock for one of the logic gates of each of the first sets of logic gates, and wherein the output driver is oversized.

7. The DLL circuit of claim 2, wherein the delay stages each comprise an output driver configured to generate an output clock for one of the logic gates of each of the first sets of logic gates, and wherein the output clock of one or more of the delay stages is received by one or more logic gates of the first sets of logic gates.

8. The DLL circuit of claim 2, wherein the logic gates of the first sets of logic gates are oversized.

9. The DLL circuit of claim 2, wherein the outputs of at least two of the logic gates of the first sets of logic gates is received by each logic gate of the second sets of logic gates.

10. The DLL circuit of claim 2, wherein the logic gates of the second sets of logic gates are oversized.

11. A method of using a DLL circuit, the method comprising:
with a delay line having a plurality of delay stages:
receiving an input clock defining an input clock period;
with each of the delay stages, generating a corresponding output clock having a phase relative to the input clock based on a delay of the delay line; and
generating a delay line output based on the output clocks of the delay stages;
with a feedback control loop circuit:
determining a phase difference between the delay line output and a reference clock;
setting a mode to a first mode responsive to determining that the phase difference is not greater than a threshold difference, and to a second mode responsive to determining that the phase different is greater than the threshold difference; and
controlling the delay of the delay line so as to cause the phase difference between the input clock and the delay line output to be kept substantially equal to the input clock period;
with a multiplexer, selectively outputting the input clock to the delay line by:
in the first mode, outputting the input clock as the reference clock; and
in the second mode, outputting the input clock as the delay line output, such that the delay line is configured as a ring oscillator in the second mode; and
with an edge combiner, generating a DLL output clock based on the output clocks of the delay stages, wherein the edge combiner presents an equal schematic load for each of the output clocks of the delay stages.

12. The method of claim 11, wherein the edge combiner comprises a plurality of first sets of logic gates and a plurality of second sets of logic gates, wherein the method further comprises:
with each logic gate of each set of the first sets of logic gates, receiving an output clock of a different one of the delay stages; and
with one or more of the logic gates of each set of the first sets of logic gates, generating an output for a corresponding set of logic gates of the second sets of logic gates,
wherein each of the one or more of the logic gates of the first sets of logic gates generating the output for the corresponding set of logic gates of the second sets of logic gates has an equal schematic output load.

13. The method of claim 12, wherein the edge combiner comprises a third set of logic gates, wherein the method further comprises:
with each logic gate of each set of the second sets of logic gates, receiving outputs of a different pair of logic gates of the first sets of logic gates; and
with at least two of the logic gates of each set of the second sets of logic gates, generating an output for a corresponding logic gate of the third set of logic gates,
wherein each of the at least two logic gates of the second sets of logic gates generating the output for the corresponding logic gate of the third set of logic gates has an equal schematic output load.

14. The method of claim 13, further comprising, with each logic gate of the third set of logic gates, receiving outputs of a different set of the second sets of logic gates.

15. The method of claim 14, with the logic gates of the third set of logic gates, generating a clock having a frequency different from a frequency of the clocks generated by one or more other logic gates of the third set of logic gates.

16. The method of claim 12, wherein the delay stages each comprise an output driver, and wherein the method further comprises, with the output driver of each of the delay stages, generating an output clock for one of the logic gates of each of the first sets of logic gates, wherein the output driver is oversized.

17. The method of claim 12, wherein the delay stages each comprise an output driver, and wherein the method further comprises:
with the output driver of each of the delay stages, generating an output clock for one of the logic gates of each of the first sets of logic gates; and
with one or more logic gates of the first sets of logic gates, receiving the output clock of one or more of the delay stages.

18. The method of claim 12, wherein the logic gates of the first sets of logic gates are oversized.

19. The method of claim 12, further comprising, with each logic gate of the second sets of logic gates, receiving the outputs of at least two of the logic gates of the first sets of logic gates.

20. The method of claim 12, wherein the logic gates of the second sets of logic gates are oversized.

* * * * *